(12) United States Patent
Kim

(10) Patent No.: US 7,498,121 B2
(45) Date of Patent: Mar. 3, 2009

(54) MANUFACTURING METHOD OF PLASMA DISPLAY PANEL

(75) Inventor: Joon-Hyeong Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 671 days.

(21) Appl. No.: 11/139,421

(22) Filed: May 27, 2005

(65) Prior Publication Data

US 2006/0068333 A1    Mar. 30, 2006

(30) Foreign Application Priority Data

Sep. 23, 2004    (KR) .................. 10-2004-0076443

(51) Int. Cl.
*H01J 9/24*    (2006.01)

(52) U.S. Cl. .................. 430/321; 430/198; 430/330; 445/24

(58) Field of Classification Search .................. None
See application file for complete search history.

(56) References Cited

U.S. PATENT DOCUMENTS 5,906,527 A * 5/1999 Shaikh et al. .................. 445/24
2004/0072493 A1 * 4/2004 Fujinaga et al. .................. 445/24
2005/0041001 A1 * 2/2005 Sumida et al. .................. 345/60

FOREIGN PATENT DOCUMENTS

JP    2003-51258    2/2003

OTHER PUBLICATIONS

Patent Abstracts of Japan, Publication No. 2003-051258, dated Feb. 21, 2003, in the name of Keisuke Sumita et al.

* cited by examiner

*Primary Examiner*—John A. McPherson
(74) *Attorney, Agent, or Firm*—Christie, Parker & Hale, LLP

(57) ABSTRACT

At least one plasma display panel having barrier ribs for partitioning discharge cells is manufactured from first and second substrates. The manufacturing method includes forming the barrier ribs according to a process including forming a barrier rib forming layer on the first substrate, forming a resist covering the barrier rib forming layer, patterning the resist to form openings thereof corresponding to a predetermined discharge cell pattern, etching the barrier rib forming layer according to the resist pattern, and baking the etched barrier rib forming layer. During the patterning of the resist, an area of an opening distal from a center of the first substrate is formed different from an area of an opening in the vicinity of the center of the first substrate.

18 Claims, 5 Drawing Sheets

MANUFACTURING METHOD OF PLASMA DISPLAY PANEL

CROSS-REFERENCE TO RELATED APPLICATION

This application claims priority to and the benefit of Korean Patent Application 10-2004-0076443 filed in the Korean Intellectual Property Office on Sep. 23, 2004, the entire content of which is incorporated herein by reference.

FIELD OF THE INVENTION

The present invention relates to a manufacturing method of a plasma display panel. More particularly, the present invention relates to a manufacturing method of a plasma display panel by which discharge cells are formed more uniformly according to an enhancement of the barrier rib forming process.

BACKGROUND OF THE INVENTION

Generally, a plasma display panel (PDP) is a display device which excites phosphors with vacuum ultraviolet rays radiated from plasma obtained through gas discharging, and displays desired images by visible light generated by the excited phosphors. As the PDP enables a wide screen with a high resolution, it has been spotlighted as a future generation flat panel display.

Typically, a PDP is structured in a three-electrode surface discharge scheme. In this scheme, two electrodes are coplanarly formed on one substrate and address electrodes are formed on another substrate apart from the one substrate by a predetermined gap. Barrier ribs are formed between the two substrates so as to partition a plurality of discharge cells.

Conventionally, each PDP is manufactured separately, and resulting in an increase in production cost due to low productivity. Therefore, a multi-panel production technology is under development, wherein a plurality of PDPs are formed as substrates facing each other and then, the substrates are cut into individual PDPs.

Meanwhile, barrier ribs are typically formed by the following process. Firstly, a barrier rib layer and a resist are consecutively formed on a front surface of a substrate, and then the resist is patterned to a predetermined pattern using a mask. In this case, the resist is patterned to form openings corresponding to a discharge cell pattern. Subsequently, the barrier rib layer is etched according to the pattern of the resist and is then baked. At this time, the etched portion of the barrier rib layer is formed as a discharge space.

The barrier rib layer may be etched by a sandblast method, in which the barrier rib layer is applied with abrasives so as to etch portions that have not been formed with the resist.

Because PDPs are becoming larger and the PDPs are manufactured by multi-panel technology, the barrier rib layer may fail to be etched with sufficient uniformity. In particular, near the center of the substrate formed PDPs, the flow of abrasives may be blocked for various reasons and the barrier rib layer may not be sufficiently etched. Therefore, near the center of the substrate, barrier ribs are formed with greater width than other portions, and accordingly the discharge space becomes smaller.

Thereby, a uniformity of discharge voltage and brightness of the panel is deteriorated, and a stain of discharge may result deteriorating display characteristics.

The information disclosed in this Background of the Invention section is only for enhancement of understanding of the background of the invention and therefore, unless explicitly described to the contrary, it should not be taken as an acknowledgement or any form of suggestion that this information constitutes a description of prior art that is already known to a person of ordinary skill in the art.

SUMMARY OF THE INVENTION

The present invention provides a method of manufacturing a PDP having uniform barrier ribs and discharge spaces.

An exemplary method of manufacturing a PDP according to an embodiment of the present invention relates to manufacturing of at least one PDP from a first and a second substrate. The PDP has barrier ribs partitioning discharge cells, and electrodes for a discharge in respective discharge cells. The method includes forming barrier ribs. In the forming of the barrier ribs, a barrier rib forming layer is formed on the first substrate, a resist is formed to cover the barrier rib forming layer, the resist is patterned so as to form openings thereof corresponding to a predetermined discharge cell pattern, the barrier rib forming layer is etched according to the resist pattern, and the etched barrier rib forming layer is baked. During the patterning of the resist, an area of an opening distal from a center of the first substrate is formed differently from an area of an opening in the vicinity of the center of the first substrate. In one embodiment, the present invention is a method for forming a plurality of barrier ribs for a plasma display panel. The method includes: forming a barrier rib forming layer on a substrate; forming a resist covering the barrier rib forming layer; patterning the resist to form a plurality of openings corresponding to a predetermined discharge cell pattern of the plasma display panel, wherein an opening farther from a center of the substrate has a different size area from an opening closer to the center of the substrate; etching the barrier rib forming layer according to the plurality of openings; and baking the etched barrier rib forming layer.

During the pattering of the resist, the area of the opening distal from the center of the first substrate may be formed smaller than the area of the opening in the vicinity of the center of the first substrate.

During the patterning of the resist, an area of an opening disposed in a first region may be formed larger than an area of an opening disposed in a second region, wherein the first region is of a circular shape with its center at the center of the first substrate, and the second region is defined as an exterior of the first region.

The first region may include a plurality of partial regions in each of which openings have the same size, and boundary lines of each of the plurality of partial regions are formed as circular shapes, each having its center at the center of the first substrate The openings may be formed in a larger size in a partial region including the center of the first substrate than the size of openings formed in a second partial region farther from the center of the first substrate.

During the etching of the barrier rib forming layer, the barrier rib forming layer may be etched by a sandblasting method.

The resist may be a photoresist or a dry film resist.

During the forming of the barrier rib forming layer, the barrier rib forming layer may be formed corresponding to each predetermined region of the plasma display panels.

After etching the barrier rib forming layer and before baking the etched barrier rib forming layer, the resist may be removed.

DETAILED DESCRIPTION

An embodiment of the present invention will hereinafter be described in detail with reference to the accompanying drawings.

Figure 1:
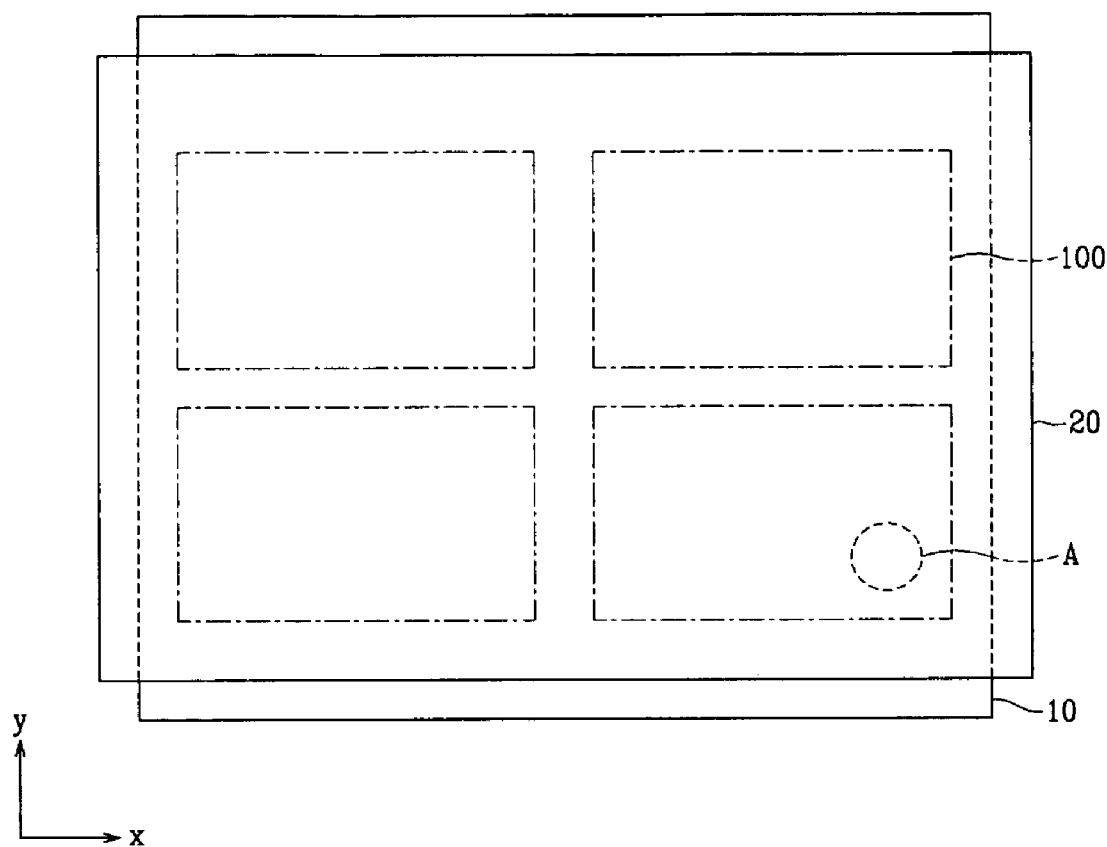
FIG. 1 is a top plan view showing a first substrate and a second substrate forming a plurality of PDPs.
Figure 2:
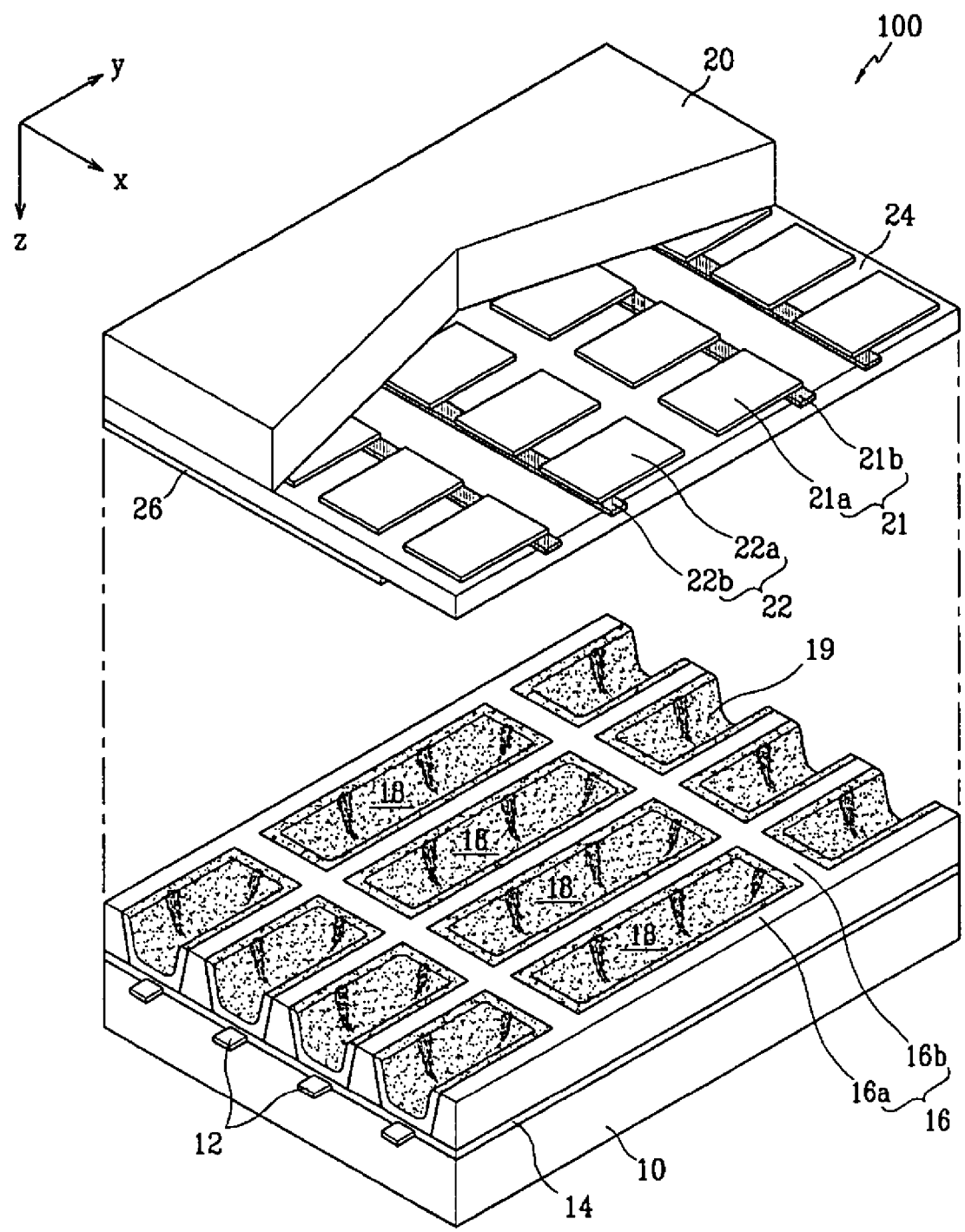
FIG. 2 is a partial exploded perspective view of the portion A in FIG. 1.

FIG. 1 is a top plan view showing a first substrate and a second substrate forming a plurality of PDPs. FIG. 2 is a partial exploded perspective view of the portion A in FIG. 1.

A first substrate 10 (hereinafter called a rear substrate) and a second substrate 20 (hereinafter called a front substrate) are disposed facing each other and apart by a predetermined gap, and a plurality of PDPs 100 are formed thereat.

For each PDP 100, address electrodes 12, a first dielectric layer 14, barrier ribs 16, and a phosphor layer 19 are formed on the rear substrate 10. Display electrodes 21 and 22, a second dielectric layer 24, and a protective layer 26 are formed on the front substrate 20.

Each PDP 100 will hereinafter be described in further detail with reference to FIG. 2.

The address electrodes 12 are formed along a direction (y-axis direction in FIG. 2) on the rear substrate 10 at its surface facing the front substrate 20. And, the first dielectric layer 14 is formed on the rear substrate 10 and covers the address electrodes 12. The address electrodes 12 are formed parallel to each other maintaining a predetermined spacing between adjacent address electrodes.

Barrier ribs 16 partitioning a plurality of discharge cells 18 are formed on the dielectric layer 14. The barrier ribs 16 include first barrier rib members 16a formed in parallel with the address electrodes 12 (i.e., in the y-axis direction shown in FIG. 2), and second barrier rib members 16b formed in a direction crossing the address electrodes 12 (i.e., x-axis direction in FIG. 2). Thus, a planar shape of the discharge cells 18 becomes substantially rectangular.

The present invention should not be understood to be limited to the above described barrier rib structure. To the contrary, the present invention may be applied to various barrier rib structures such as a striped structure in which the barrier rib members are formed only in parallel with the address electrodes, and such a barrier rib structure should be understood to lie within the spirit and scope of the present invention. The planar shape of the discharge cells may also be altered to be a hexagon, circle, or ellipse, and such variations should be understood to also lie within the spirit and scope of the present invention.

A phosphor layer 19 of red, green, or blue color is formed in each discharge cell 18, and discharge gas for generating a plasma discharge are filled therein.

On an interior side of the front substrate 20 facing the rear substrate 10, display electrodes 21 and 22 are formed in a direction crossing the address electrodes 12 (i.e., the x-axis direction shown in FIG. 2). The display electrodes 21 and 22 include a scan electrode 21 and a sustain electrode 22.

The scan electrode 21 and the sustain electrode 22 respectively include bus electrodes 21b and 22b elongated along a direction crossing the address electrodes 12 and extension electrodes 21a and 22a extending from the bus electrodes 21b and 22b toward a center of the respective discharge cell 18.

The extension electrodes 21a and 22a are for causing a plasma discharge in the discharge cell 18. The extension electrodes may be formed of, for example, indium tin oxide (ITO) that is a transparent material, for sufficient aperture ratio. The bus electrodes 21b and 22b are used for providing sufficient conductivity of the display electrodes by compensating for the high electric resistance of the extension electrodes 21a and 22a, and may be formed as a metal material.

A second dielectric layer 24 and an MgO protective layer 26 are consecutively formed on the front substrate 20, covering the display electrodes 21 and 22. The MgO protective layer 26 protects the second dielectric layer 24 from collisions of ions during the plasma discharge, and enhances discharge efficiency due to its high secondary electron emission coefficient.

The above-described structure of a PDP is only an exemplary one, and the present invention should not be understood to be limited thereto. The present invention may be applied to various other types of PDPs, and such variations should be understood to lie within the spirit and scope of the present invention.

In a method of manufacturing a PDP according to an embodiment of the present invention, the address electrodes 12, the first dielectric layer 14, the barrier ribs 16, and the phosphor layer 19 are formed on the rear substrate 10, and the display electrodes 21 and 22, the second dielectric layer 24, and the MgO protective layer 26 are formed on the front substrate 20. Subsequently, the rear and front substrates 10 and 20 are cut into a plurality of PDPs 100.

The forming of the address electrodes 12, the first dielectric layer 14, and the phosphor layer 19 on the rear substrate 10, and the forming of the display electrodes 21 and 22, the dielectric layer 24, and the MgO protective layer 26 on the front substrate 20 may be performed according to a conventional scheme, and thus are not described in further detail. Instead, forming of the barrier ribs 16 will be described in detail hereinafter.

FIG. 3A to FIG. 3E are sectional views illustrating steps of forming the barrier ribs 16 in a manufacturing method of a PDP, according to an embodiment of the present invention. In FIG. 3A through 3E, for better comprehension, only parts related to forming of the barrier ribs 16 are shown.

Figure 3A:
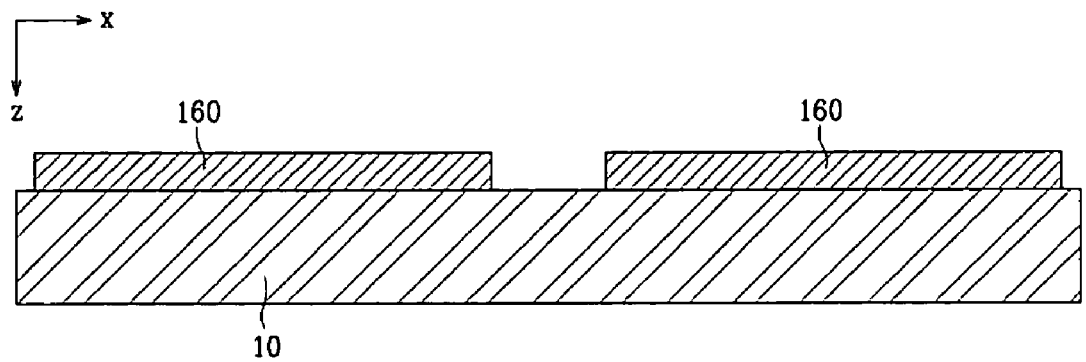
FIG. 3A to FIG. 3E are sectional views illustrating steps of forming barrier ribs in a method of manufacturing a PDP, according to an embodiment of the present invention.

Firstly, as shown in FIG. 3A, a barrier rib forming layer 160 corresponding to each of the plurality of PDPs is formed on the rear substrate 10. The barrier rib forming layer 160 may be formed by applying a paste for the barrier ribs on the rear substrate 10 and drying it.

Although, the barrier rib forming layer 160 described above, and shown in the drawings, is formed only on predetermined portions corresponding to the PDPs 100, the present invention should not be understood to be limited thereto. For example, the barrier rib forming layer 160 may be formed on an entire surface of the substrate.

Figure 3B:
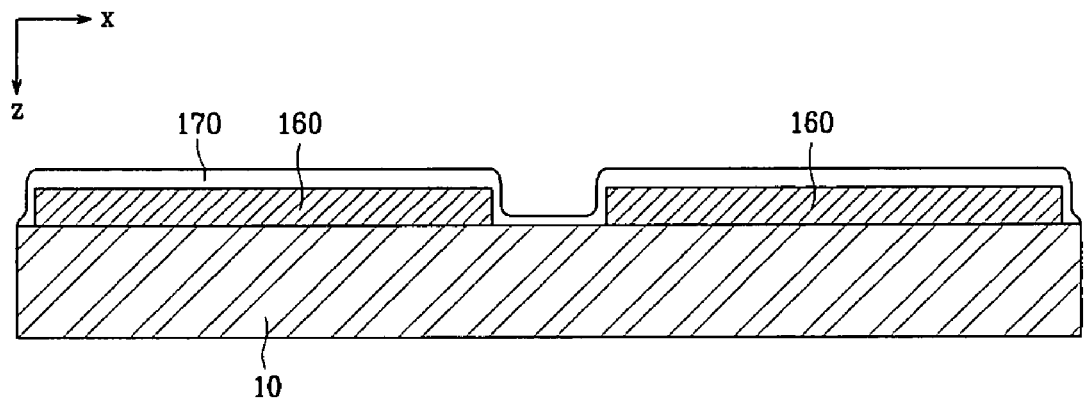

Subsequently, as shown in FIG. 3B, a resist 170 is formed on the rear substrate 10, covering the barrier rib forming layer 160. In this case, the resist 170 may be a photoresist (PR), a dry film resist (DFR), or other similar materials. Although, the drawing illustrates that the resist 170 covers the entire surface of the rear substrate 10, the present invention is not limited thereto. It is noted that the resist may cover only the barrier rib forming layer 160.

Figure 3C:
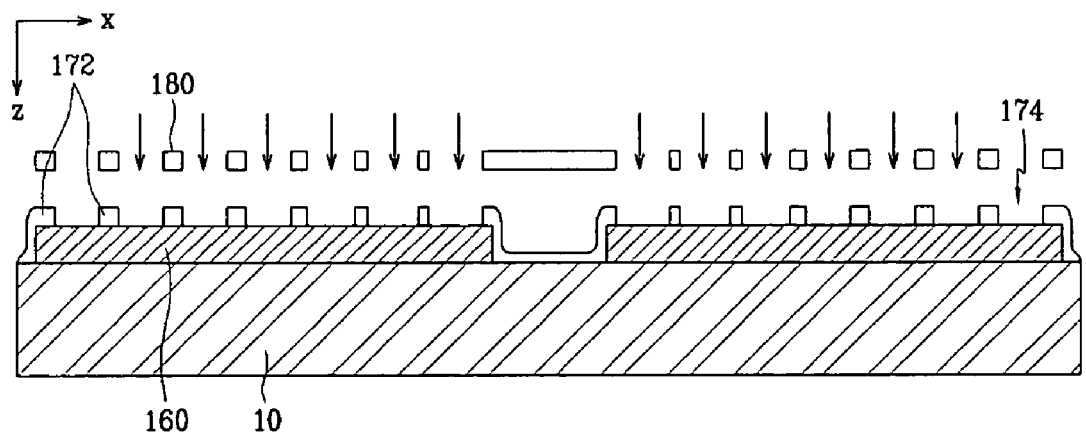

As shown in FIG. 3C, the resist 170 is then patterned to form a resist pattern 172 having openings 174 according to a predetermined discharge cell pattern. In this case, an exposure mask 180 is placed on the resist 170, and the resist 170 is exposed and developed so as to form a resist pattern 172 having openings 174 of a discharge cell pattern.

During such a patterning of the resist 170, the resist pattern 172 is formed such that the openings 174 may have different areas according to their positions. Different opening areas of the openings 174 may be formed by an exposure mask 180 that already has such different opening areas, or by various other schemes.

Figure 4:
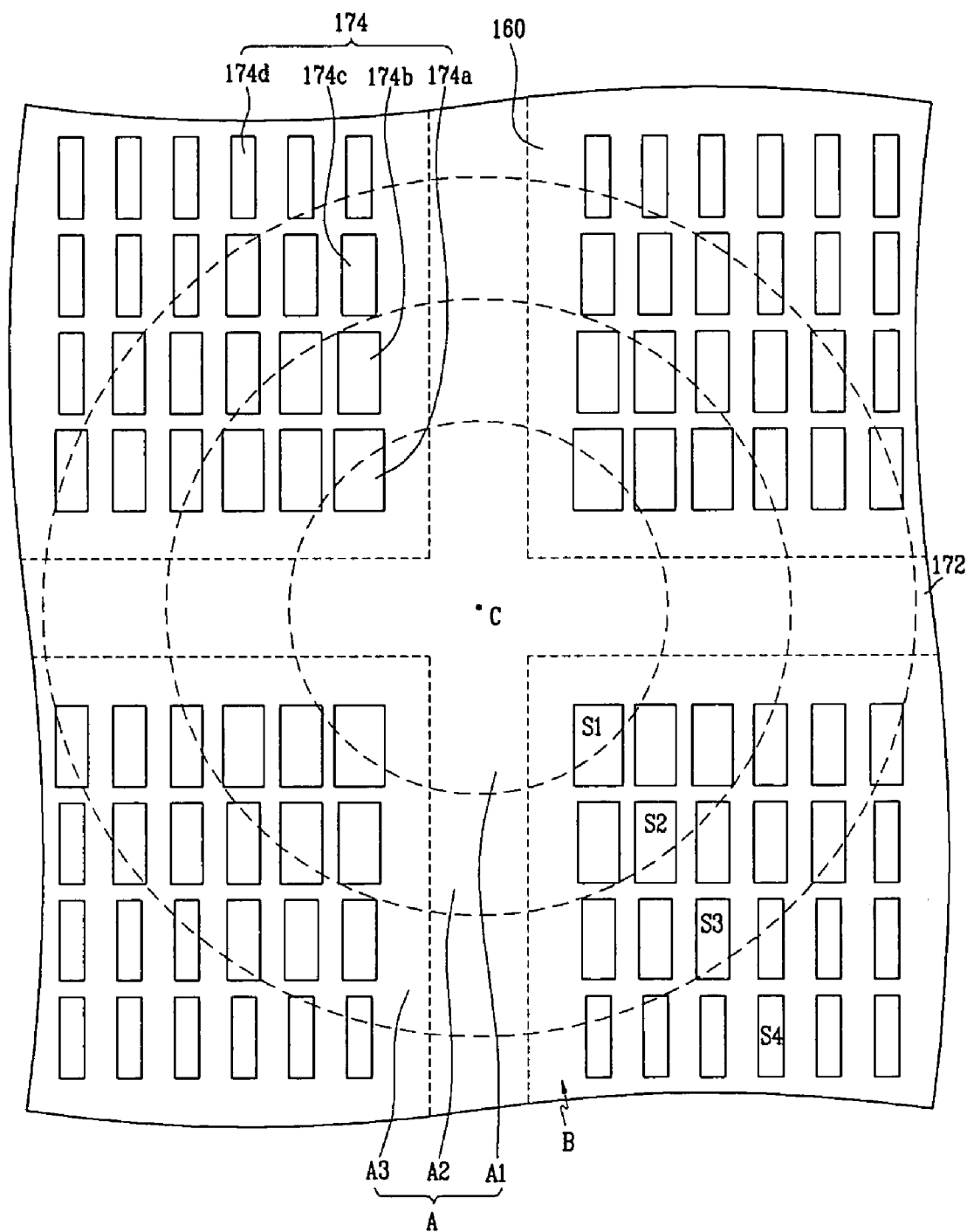
FIG. 4 is a top plan view of a resist pattern formed according to an embodiment of the present invention.

Hereinafter, an exemplary resist pattern 172 according to an embodiment of the present embodiment will be described in detail with reference to FIG. 4. FIG. 4 is a top plan view of a resist pattern formed according to an embodiment of the present invention.

An area of an opening 174d distal from a center C of the first substrate 10 is formed having a smaller size than the area of an opening 174a in the vicinity of the center C of the first substrate 10. Areas of the openings 174 are formed in different sizes according to their positions because an amount of etching may be different when the barrier ribs and the discharge cells are formed by, for example, a sandblast method.

For better uniformity of discharge cells, all opening areas located within the same distance from the center C of the first substrate 10 are the same size. Other opening areas are then formed in decreasing sizes, as the openings 174 are located farther away from the center C of the substrate.

In more detail, first and second regions A and B are defined on the first substrate 10, wherein the first region A is of a circular shape with its center at the center C of the first substrate 10, and the second region B is defined as an exterior region of the first region A. The first region A is divided into a plurality of partial regions A1, A2, and A3. The boundaries of the respective partial regions A1, A2, and A3 are formed by concentric circular shapes with their centers at the center C of the first substrate 10. Openings 174 having their centers in the same partial regions A1, A2, or A3 are substantially the same size.

According to an embodiment of the present invention, each of the boundaries of the partial regions A1, A2, and A3, and the first region A itself are formed as circular shapes, however, the present invention is not to be limited thereto. Each of the regions may be formed as a different shape such as, a rectangle or a hexagon, and such different shapes should be understood to lie within the spirit and scope of the present invention.

According to the present embodiment, the partial regions A1, A2, and A3 are respectively called a first partial region A1, a second partial region A2, and a third partial region A3. In this case, the openings 174 satisfy a condition of S1>S2>S3>S4.

Here, S1 denotes the area of the openings 174a having their centers within the first partial region A1, S2 denotes the area of the openings 174b having their centers within the second partial region A2, S3 denotes the area of the openings 174c having their centers within the third partial region A3, and S4 denotes the area of the openings 174d having their centers within the second region B.

That is, within the first region A, the areas of the openings 174a, 174b, 174c become smaller as they go from the first partial region A1, including the center of the first substrate 10, to the third partial region A3 adjacent to the second region B. In addition, the openings 174d in the second region B have a smaller area S4 than each of the openings 174a, 174b, 174c in the first region A.

Figure 3D:
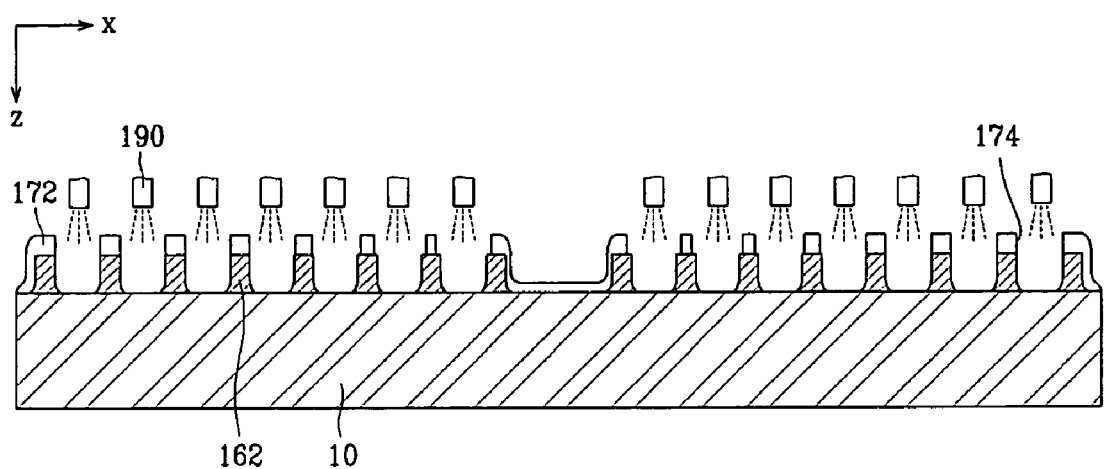

Subsequently, as shown in FIG. 3D, the barrier rib forming layer 160 is etched according to the resist pattern 172 so as to remove portions corresponding to the discharge cell pattern, such that discharge cell spaces may be formed. In this case, the barrier rib forming layer 160 may be etched by wet etching or dry etching. In one embodiment of the present invention, the barrier rib forming layer 160 is etched by a sandblast method which is a type of dry etching. That is, a sandblast apparatus 190 etches the barrier rib forming layer 160 at portions for the openings 174 by spraying abrasives onto the barrier rib forming layer 160 formed with the resist pattern 172.

As described above, according to the present embodiment, the resist pattern 172 has larger openings at central portions where more factors block the etching of the barrier rib forming layer 160 and thus deterioration of abrasion at the central portion is compensated. Therefore, the barrier rib forming layer 160 is etched with uniformity throughout the entire rear substrate 10. Accordingly, the barrier ribs and discharge cells are uniformly formed.

Figure 3E:
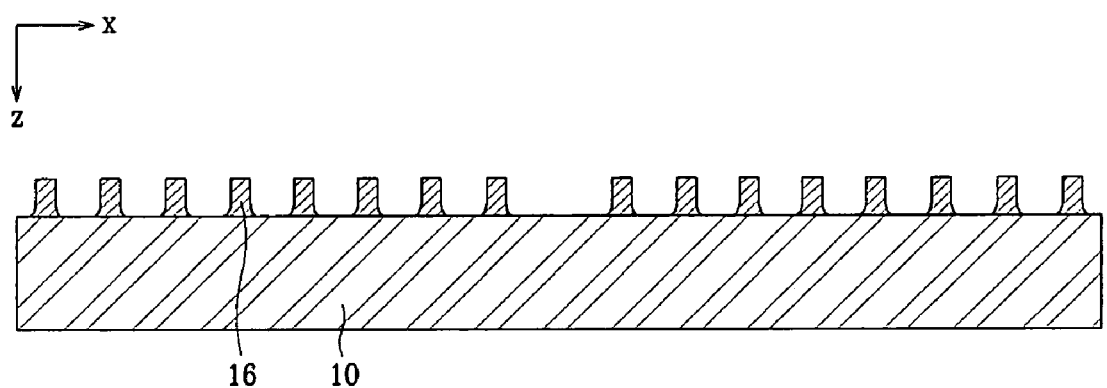

Subsequently, as shown in FIG. 3E, the resist pattern 172 is removed, and then the barrier ribs 16 are completed by baking the barrier rib pattern 162.

As describe above, according to an embodiment of the present embodiment, openings 174 of at the resist 170 are formed in consideration of factors blocking the flow of abrasives during patterning of the resist 170. Accordingly, uniform discharge voltage and uniform luminescence characteristics are achieved throughout an entire panel. Therefore, stains of a discharge are prevented so as to enhance display characteristics.

According to an embodiment of the present invention, openings 174 of the resist are formed as a rectangular shape, however, the present invention should not be understood to be limited thereto. To the contrary, various shapes of openings may be formed according to a desired pattern of discharge cells, and such various shapes of openings should be understood to lie within the spirit and scope of the present invention.

In addition, although the present invention has been explained in connection with an exemplary embodiment applied to a multi-panel production technology, the present invention may also be applied to other schemes, for example, a scheme in which only one PDP is manufactured from one rear substrate and one front substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing at least one plasma display panel from a first substrate and a second substrate, the plasma display panel comprising barrier ribs for partitioning discharge cells and electrodes for discharging respective discharge cells, the method comprising forming a plurality of barrier ribs, wherein the forming of the barrier ribs comprises:
    forming a barrier rib forming layer on the first substrate;
    forming a resist covering the barrier rib forming layer;
    patterning the resist to form a resist pattern; and
    etching the barrier rib forming layer through the resist pattern having larger openings at central portion where more factors block the etching of the barrier rib forming layer and thus deterioration of the etching at the central portion is compensated, therefore the barrier rib forming layer is etched substantially uniformly throughout the entire first substrate so that the barrier ribs and the discharge cells are substantially uniformly formed.

2. The method of claim 1, wherein, during the patterning of the resist, an area of an opening disposed in a first region is formed larger than an area of an opening disposed in a second region, wherein the first region is of a circular shape with its center at the center of the first substrate, and the second region is defined as an exterior of the first region.

3. The method of claim 2, wherein the first region comprises a plurality of partial regions in each of which openings have the same size, and boundary lines of each of the plurality of partial regions are formed as circular shapes, each circular shape having its center at the center of the first substrate.

4. The method of claim 3, wherein the openings are formed in a larger size in a first partial region closer to the center of the first substrate than the size of openings formed in a second partial region farther from the center of the first substrate.

5. The method of claim 1, wherein during the etching of the barrier rib forming layer, the barrier rib forming layer is etched by sandblasting.

6. The method of claim 1, wherein the resist comprises one of a photoresist and a dry film resist.

7. The method of claim 1, wherein a plurality of predetermined regions each corresponding to a plasma display panel are defined on the first substrate and the barrier rib forming layer is formed on each corresponding predetermined region.

8. The method of claim 1, further comprising removing the resist, after the etching of the barrier rib forming layer.

9. A method for forming a plurality of barrier ribs for a plasma display panel, the method comprising:

forming a barrier rib forming layer on a substrate;
forming a resist covering the barrier rib forming layer;
patterning the resist to form a resist pattern;
etching the barrier rib forming layer through the resist pattern having larger openings at central portion where more factors block the etching of the barrier rib forming layer and thus deterioration of the etching at the central portion is compensated, therefore the barrier rib forming layer is etched substantially uniformly throughout the entire substrate so that the barrier ribs and corresponding discharge cells are substantially uniformly formed; and
baking the etched barrier rib forming layer.

10. The method of claim 9, wherein an area of a first opening located in a first region is larger than an area of a second opening located in a second region, where the first region has a circular shape with a center at the center of the substrate, and the second region is defined as an exterior of the first region.

11. The method of claim 10, wherein the first region comprises a plurality of partial regions each having a circular shape with a center at the center of the substrate, and wherein the openings in each of the plurality of partial regions have the same size.

12. The method of claim 11, wherein larger size openings are formed in a first partial region closer to the center of the substrate and smaller openings are formed in a second partial region farther from the center of the substrate.

13. The method of claim 9, wherein the etching of the barrier rib forming layer comprises sandblasting.

14. The method of claim 9, wherein the resist comprises one of a photoresist and a dry film resist.

15. The method of claim 9, wherein the forming the barrier rib forming layer comprises applying a paste layer on the substrate.

16. The method of claim 9, wherein the barrier rib forming layer is formed on predetermined portions on the substrate.

17. The method of claim 9, wherein the barrier rib forming layer is formed on an entire surface of the substrate.

18. The method of claim 9, further comprising removing the resist, after etching the barrier rib forming layer and before baking the etched barrier rib forming layer.

* * * * *